(12) United States Patent
Hung

(10) Patent No.: US 8,792,285 B2
(45) Date of Patent: Jul. 29, 2014

(54) PAGE BUFFER CIRCUIT

(75) Inventor: Ji-Yu Hung, Miaoli (TW)

(73) Assignee: Macronix International Co., Ltd., Hsinchu (TW)

( * ) Notice: Subject to any disclaimer, the term of this patent is extended or adjusted under 35 U.S.C. 154(b) by 122 days.

(21) Appl. No.: 13/310,315

(22) Filed: Dec. 2, 2011

(65) Prior Publication Data

US 2013/0141977 A1 Jun. 6, 2013

(51) Int. Cl.
*G11C 7/10* (2006.01)
(52) U.S. Cl.
USPC ............ 365/189.05; 365/185.17; 365/185.05; 365/185.22
(58) Field of Classification Search
USPC ............................. 365/185.17, 185.2, 189.05
See application file for complete search history.

(56) References Cited

U.S. PATENT DOCUMENTS

| 2001/0014037 A1* | 8/2001 | Kim et al. ................ 365/185.18 |
| 2005/0248991 A1* | 11/2005 | Lee et al. ................ 365/185.28 |
| 2006/0221697 A1* | 10/2006 | Li et al. .................... 365/185.18 |
| 2007/0091681 A1* | 4/2007 | Gongwer et al. ........ 365/185.12 |
| 2007/0147121 A1* | 6/2007 | Futatsuyama ............ 365/185.17 |
| 2009/0031075 A1* | 1/2009 | Kim .............................. 711/103 |
| 2010/0302852 A1* | 12/2010 | Oh ........................... 365/185.12 |

* cited by examiner

*Primary Examiner* — Son Dinh
*Assistant Examiner* — Uyen B Tran
(74) *Attorney, Agent, or Firm* — Kenta Suzue; Haynes Beffel & Wolfeld LLP

(57) ABSTRACT

A page buffer circuit is coupled to a bit line of a memory array. The page buffer circuit includes a latch storing different data during different phases of a multi-phase program operation. A preparation phase is after the program phase and after the program verify phase of the present multi-phase program operation. For the preparation phase, the control circuitry causes the latch to store the preparation data indicating whether to program the memory cell in a subsequent multi-phase program operation following the present multi-phase program operation. Results of the program verify phase, and contents of the latch at a start of the present multi-phase program operation, are sufficient to determine the preparation data.

20 Claims, 5 Drawing Sheets

|  |  | phase 1 : PGM (node SEN/INV) | phase 2: PV (node SEN/INV) | phase3 : strobe (node SEN/INV) | phase 4: data combination (node SEN/INV) |
|---|---|---|---|---|---|
| PGM | Hvt | 0/0 | 1/0 | 1/0 | 0/1 |
| PGM | Lvt | 0/0 | 0/0 | 0/1 | 1/0 |
| inhibit | Hvt | 1/1 | 0/1 | 0/1 | 1/1 |
| inhibit | Lvt | 1/1 | 0/1 | 0/1 | 1/1 |

Fig. 2

|  |  | phase 1: PGM (node SEN/INV) | phase 2: PV (node SEN/INV) | phase 3: data combination (node SEN/INV) | phase 4: reset INV (node SEN/INV) | phase 5: strobe (node SEN/INV) | phase 6: data invert (node SEN/INV) |
|---|---|---|---|---|---|---|---|
| PGM | Hvt | 0/0 | 1/0 | 1/0 | 1/0 | 1/0 | 0/1 |
| PGM | Lvt | 0/0 | 0/0 | 0/0 | 0/0 | 0/1 | 1/0 |
| inhibit | Hvt | 1/1 | 0/1 | 1/1 | 1/1 | 1/0 | 0/1 |
| inhibit | Lvt | 1/1 | 0/1 | 0/1 | 1/1 | 1/0 | 0/1 |

Fig. 4

PAGE BUFFER CIRCUIT

BACKGROUND

1. Field of the Invention

This technology relates to a page buffer.

2. Description of Related Art

Memory cells in a typical memory array can be accessed by thousands of bit lines, and in turn by thousands of page buffer circuits.

An example page buffer circuit design includes at least two latches. A first latch stores different data over the different phases of a multi-phase program operation. During one of the phases of the program operation, the results of a prior multi-phase program operation are required. However, because of the often changing data in the first latch, the first latch by itself does not store the results of a prior multi-phase program operation.

A second latch in the page buffer circuit stores the results of a prior multi-phase program operation in a location readily accessible within each page buffer circuit. The overall area of the integrated circuit is increased by the multiple latches of each page buffer circuit. An example page buffer circuit design discussed above is disclosed in FIGS. 1 and 2.

SUMMARY

One aspect of the technology is an apparatus including a page buffer circuit and control circuitry.

The page buffer circuit is coupled to a bit line of a memory array. The page buffer circuit includes a latch storing data during different phases of a multi-phase program operation. An example multi-phase program operation includes a program phase, program verify phase, data combination phase, reset phase, strobe phase, and data invert or preparation phase. An example of data stored by the latch during different phases of the multi-phase program operation are program data, program verify data, and preparation data. Depending on the particular phase of the multi-phase program operation, the data in the latch are interpreted differently by the latch. In one embodiment, a single latch is sufficient to store the different data over the different phases of the multi-phase program operation, and the page buffer circuit includes no other latch.

During the program phase, the latch stores program data that indicates whether the present multi-phase program operation is to program the memory cell. For example, program data can indicate that the memory cell is to be programmed, or that the memory cell is a program inhibit memory cell. A program inhibit memory cell was not selected to be programmed, or was selected to be programmed and was successfully programmed in a preceding program operation.

During the program verify phase, the latch stores program verify data that indicates whether the preceding program phase of the present program operation successfully programmed the memory cell. This data is not relevant for program inhibit memory cells.

The preparation data indicates whether to program the memory cell in a subsequent multi-phase program operation following the present multi-phase program operation. For example, if a memory cell undergoes programming during a program phase, the program verify phase can indicate unsuccessful programming of the memory cell. Then the preparation data can indicate that the memory cell is to undergo programming again in a subsequent multi-phase program operation. Results of the program verify phase, and contents of the latch at a start of the present multi-phase program operation, are sufficient to determine the preparation data. In one embodiment, in the preparation phase, the latch stores the preparation data indicating that the subsequent multi-phase program operation is to program the memory cell, responsive to the program verify phase indicating failure to program the memory cell.

Also, the preparation data can indicate that the memory cell is not to undergo programming again in a subsequent multi-phase program operation. For example, the program phase was successful in the present program operation, the program phase was successful in a preceding program operation, or the memory cell was program inhibited all along. In one embodiment, in the preparation phase, the latch stores the preparation data indicating that the subsequent multi-phase program operation is not to program the memory cell, responsive to the program verify phase indicating success with programming the memory cell.

In one embodiment, prior to the present multi-phase program operation, the latch stores data can have one of multiple values, including: (i) a first value indicating that the present multi-phase program is not to program the memory cell, and (ii) a second value indicating that the present multi-phase program is to program the memory cell. This data can be the preparation data of a preceding multi-phase program operation, or the program setup data for an initial multi-phase program operation.

In one embodiment the same value is stored in the latch to: (i) indicate, prior to the present multi-phase program operation, that the present multi-phase program is not to program the memory cell, and (ii) indicate, in the preparation phase, that the subsequent multi-phase program operation is not to program the memory cell. In one embodiment, the page buffer circuit includes no other latch to store this same value indicating that the subsequent multi-phase program operation is not to program the memory cell.

The control circuitry is coupled to the page buffer circuit. The control circuitry controls a present multi-phase program operation for a memory cell accessed by the bit line coupled to the page buffer circuit. The present multi-phase program operation includes a preparation phase. The preparation phase is after the program phase of the present multi-phase program operation and after the program verify phase of the present multi-phase program operation.

For the preparation phase the control circuitry causes the latch to store the preparation data indicating whether to program the memory cell in a subsequent multi-phase program operation following the present multi-phase program operation.

In one embodiment, the page buffer circuit has a sense node and a latch node. The sense node, during the program verify phase, indicates whether the memory cell accessed by the bit line coupled to the page buffer circuit was successfully programmed. The latch node indicates whether a preceding multi-phase program operation before the present multi-phase program operation failed to program the memory cell. Switch circuitry electrically connects the sense node and the latch node after the program verify phase of the present multi-phase operation, responsive to the latch node indicating that the preceding multi-phase program operation failed to program the memory cell. Example switch circuitry is a number of series-connected transistors, such as a field effect transistor.

In one embodiment, the page buffer circuit has a latch node that indicates whether a preceding multi-phase program operation before the present multi-phase program operation failed to program the memory cell. The present multi-phase program operation includes a reset phase after the program phase of the present multi-phase program operation and after the program verify phase of the present multi-phase program operation and before the preparation phase of the present multi-phase program operation. For the reset phase, the control circuitry causes the latch node to store a particular value regardless of earlier results from the present multi-phase program operation.

Another aspect of the technology is a method comprising:
during a present multi-phase program operation for a memory cell accessed by a bit line coupled to a page buffer circuit, performing a preparation phase after a program phase of the present multi-phase program operation and after a program verify phase of the present multi-phase program operation, the preparation phase causing a latch in the page buffer circuit to store preparation data indicating whether to program the memory cell in a subsequent multi-phase program operation following the present multi-phase program operation, wherein the latch stores program data, program verify data, and the preparation data during different phases of a multi-phase program operation, the results of the program verify phase and contents of the latch at a start of the present multi-phase program operation being sufficient to determine the preparation data.

Various embodiments are disclosed herein.

A further aspect of the technology is a method comprising:
during a present multi-phase program operation to program a memory cell in a memory array accessed by a bit line coupled to a page buffer, using a single latch to store preparation data indicating whether to program the memory cell in a subsequent multi-phase program operation following the present multi-phase program operation.

Yet another aspect of the technology is an apparatus comprising a page buffer circuit including a sense node, only one latch, and a NAND string of p-type transistors. The page buffer circuit and the sense node of the page buffer circuit are selectively coupled to a bit line of a memory array. The NAND string of p-type transistors electrically connects the sense node and the only one latch.

BRIEF DESCRIPTION OF THE DRAWINGS

FIG. 2 is a table showing the logical values of selected nodes in the circuit diagram of FIG. 1 over the different phases of a multi-phase program operation.

FIG. 4 is a table showing the logical values of selected nodes in the circuit diagram of FIG. 3 over the different phases of a multi-phase program operation.

DETAILED DESCRIPTION

Figure 1:
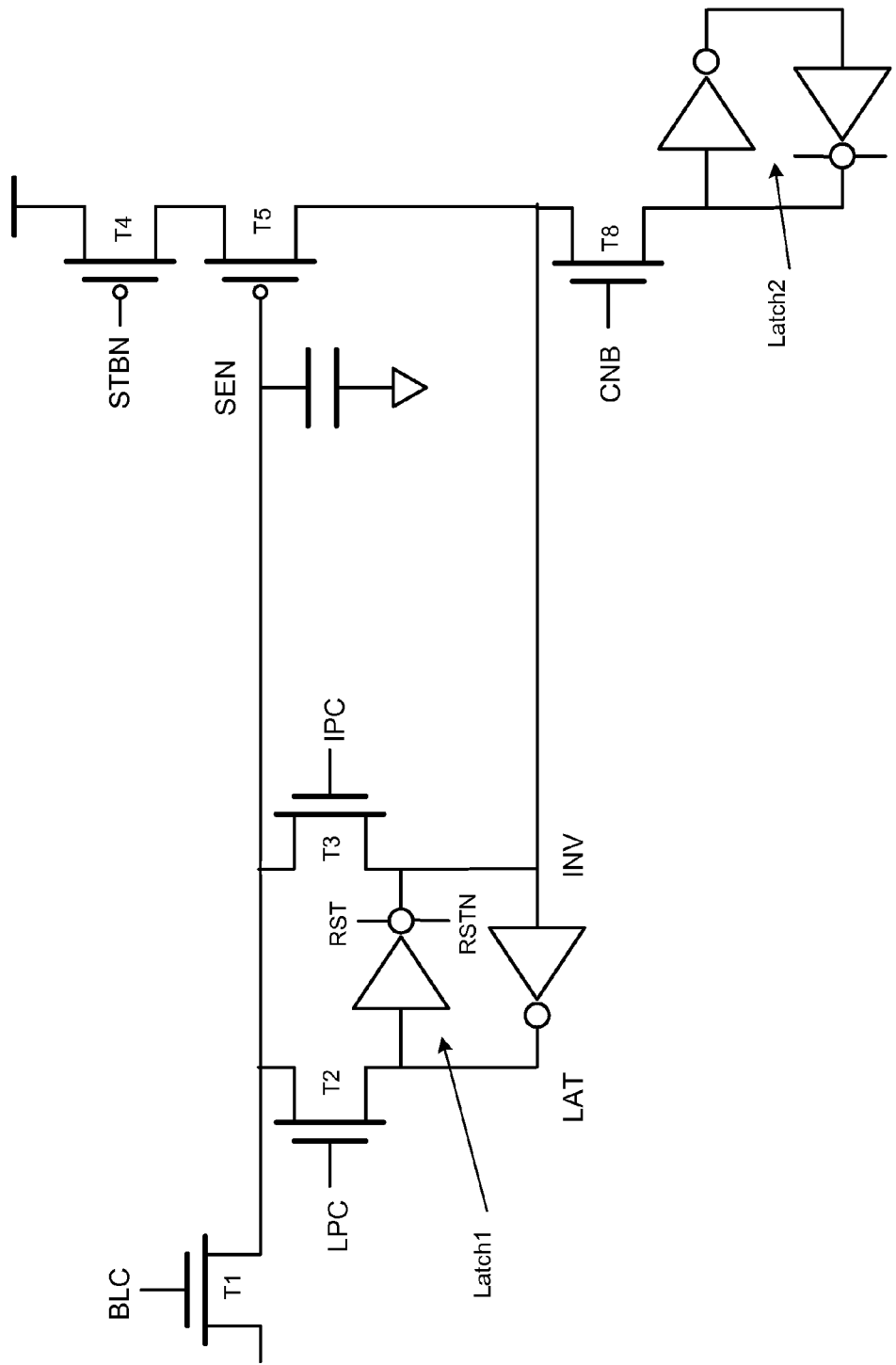
FIG. 1 is a circuit diagram of a page buffer circuit with multiple latches to store data.

FIG. 1 is a circuit diagram of a page buffer circuit with multiple latches to store data.

Transistor T1 is an n-type MOSFET controlled by signal BLC at the gate of transistor T1. Depending on signal BLC, transistor T1 connects or disconnects a bit line (not shown) and node SEN. The bit line and node SEN are connected to a source and a drain of transistor T1.

Node SEN has a capacitance as shown. Node SEN is connected to the gate of transistor T5, a p-type MOSFET. A drain of transistor T5 is connected to node INV of Latch1, discussed below.

Transistor T5 is connected in series with transistor T4, a p-type MOSFET. Transistor T4 connects a supply voltage with transistor T5. A source of transistor T4 is coupled to the supply voltage and a drain of transistor T4 is coupled to a source of transistor T5. A gate of transistor T4 connected to signal STBN.

Latch1 has two inverters cross-coupled such that the output of one is connected to the input of the other. Latch 1 has two nodes LAT and INV. The state of Signals RST and RSTN disable Latch1 when writing the latch value, and enable the latch again. Alternative implementations of the latch can use an SR latch, a D latch, an Earle latch, or other bistable circuit.

Transistor T2 connects node LAT to node SEN. Transistor T2 is an n-type MOSFET controlled by signal LPC.

Transistor T3 connects node INV to node SEN. Transistor T3 is an n-type MOSFET controlled by signal IPC.

Transistor T8 connects node INV to Latch2. Transistor T8 is an n-type MOSFET controlled by signal CNB.

Latch2 has two inverters cross-coupled such that the output of one is connected to the input of the other. Alternative implementations of the latch can use an SR latch, a D latch, an Earle latch, or other bistable circuit. Latch2 is set prior to the program operation.

FIG. 2 is a table showing the logical values of selected nodes in the circuit diagram of FIG. 1 over the different phases of a multi-phase program operation.

The table shows the logical values of nodes SEN and INV over the following phases: phase 1, PGM (program); phase 2, PV (program verify); phase 3, strobe; and phase 4, data combination.

The PGM rows of the table correspond to memory cells undergoing programming. Within the PGM rows, the Hvt row corresponds to a memory cell that was successfully programmed to the high threshold voltage state. Within the PGM rows, the Lvt row corresponds to a memory cell that was not successfully programmed, and stays at the low threshold voltage state.

The inhibit rows of the table correspond to program inhibited memory cells, or memory cells not undergoing programming. Within the inhibit rows, the Hvt row corresponds to a memory cell that stays at the high threshold voltage state. Within the inhibit rows, the Lvt row corresponds to a memory cell that stays at the low threshold voltage state.

Phase 1, the PGM (program) phase is discussed. For an initial programming operation, node INV of Latch1 is set to "0" if the page buffer is coupled to the bit line of a memory cell selected to undergo programming. For an initial programming operation, node INV of Latch1 is set to "1" if the page buffer is coupled to the bit line of a memory cell not selected to undergo programming. In subsequent programming operations after the initial programming operation, the value of node INV is set during phase 4, the data combination phase of the preceding programming operation.

Signals IPC and BLC go high to turn on transistors T3 and T1 respectively. The value of node INV is passed to node BL. The PGM phase is then executed, in which the memory cell accessed by the bit line coupled to the page buffer is programmed (or not, depending on the value of node INV).

Phase 2, the PV (program verify) phase is discussed. If the page buffer is coupled to the bit line of a memory cell not selected to undergo programming—i.e. for program inhibited memory cells—node SEN maintains "0" during the PV phase. If the page buffer is coupled to the bit line of a memory cell selected to undergo programming—i.e. for PGM memory cells—the value of node SEN depends on whether the memory cells was successfully programmed during the PGM phase. If the memory cell was successfully programmed from low threshold voltage LVt to high threshold voltage HVt, then node SEN is set to "1". However, if the memory cell was not successfully programmed such that it has low threshold voltage LVt, then node SEN is set to "0". In either case, node INV maintains its value from the beginning of the multi-phase operation, the PGM phase.

Phase 3, the strobe phase is discussed. Signal STBN goes low, turning on transistor T4. If node INV has the value of "1" from the beginning of the multi-phase operation, the PGM phase, then node INV maintains "1" during the strobe phase. If node INV has the value of "0" from the beginning of the multi-phase operation, then node INV is updated depending on the result of phase 2, the PV phase. From the PV phase, if the memory cell has high threshold voltage HVt and node SEN was set to "1", then node INV maintains "0". From the PV phase, if the memory cell has low threshold voltage LVt and node SEN was set to "0", then node INV is updated to "1".

Phase 4, the data combination phase is discussed. Phase 4, the data combination phase, prepares for the subsequent multi-phase program operation. IN phase 4, the value of node INV is modified, because Latch1 changed during phase 3, the strobe phase. Another latch, Latch 2 has been storing initial data (also called preparation data from a previous multi-phase program operation. The Latch2 data is used to determine the preparation data for the next multi-phase program operation. First, signal IPC goes high, turning on transistor T3 and passing data on node INV to node SEN. Then signal CNB goes high, turning on transistor T8, to connect Latch2 and node INV. Node INV is reset with Latch2 data. Then signal STBN goes low, turning on transistor T4 and setting Latch1 based on the value of node SEN. If initial data from Latch2 is "1", then Latch1 data is set to "1". If initial data from Latch2 is "0", then reverse Latch1 data is reversed.

Figure 3:
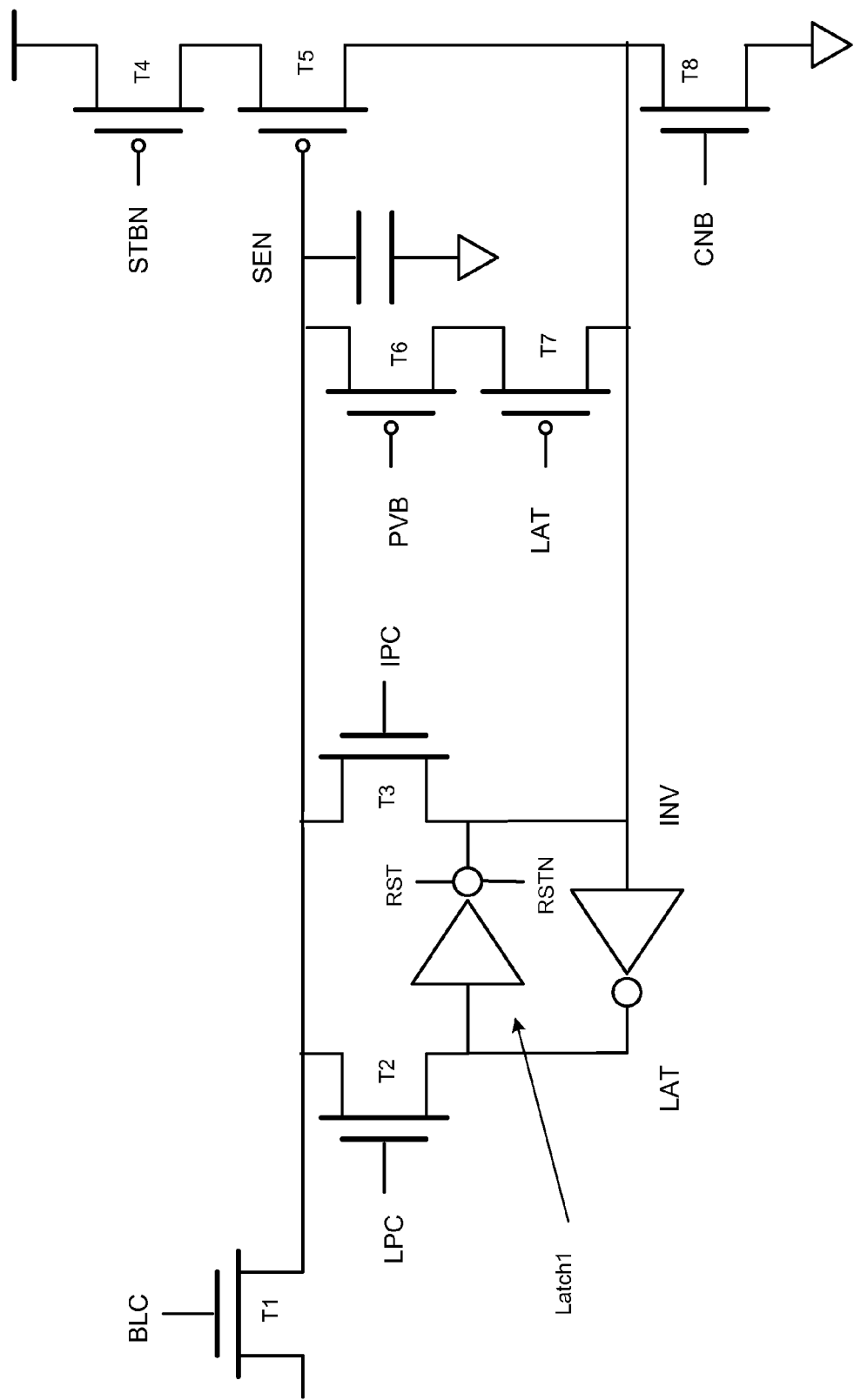
FIG. 3 is a circuit diagram of a page buffer circuit with a latch that stores different types of data during a multi-phase program operation, such as program data, program verify data, and preparation data that indicates whether a subsequent program operation is to program the memory cell.

FIG. 3 is a circuit diagram of a page buffer circuit with a latch that stores different types of data during a multi-phase program operation, such as program data, program verify data, and preparation data that indicates whether a subsequent program operation is to program the memory cell.

Transistor T1 is an n-type MOSFET controlled by signal BLC at the gate of transistor T1. Depending on signal BLC, transistor T1 connects or disconnects a bit line (not shown) and node SEN. The bit line and node SEN are connected to a source and a drain of transistor T1.

Node SEN has a capacitance as shown. Node SEN is connected to the gate of transistor T5, a p-type MOSFET. A drain of transistor T5 is connected to node INV of Latch1, discussed below.

Transistor T5 is connected in series with transistor T4, a p-type MOSFET. Transistor T4 connects a supply voltage with transistor T5. A source of transistor T4 is coupled to the supply voltage and a drain of transistor T4 is coupled to a source of transistor T5. A gate of transistor T4 connected to signal STBN.

Latch1 has two inverters cross-coupled such that the output of one is connected to the input of the other. Latch 1 has two nodes LAT and INV. Signals RST and RSTN disable Latch1 when writing the latch value, and enable the latch again. Alternative implementations of the latch can use an SR latch, a D latch, an Earle latch, or other bistable circuit.

Transistor T2 connects node LAT to node SEN. Transistor T2 is an n-type MOSFET controlled by signal LPC.

Transistor T3 connects node INV to node SEN. Transistor T3 is an n-type MOSFET controlled by signal IPC.

Transistor T6 and T7 are connected in series between nodes SEN and INV. Transistor T6 and T7 are p-type MOSFETs. A gate of transistor T6 is connected to signal PVB. A gate of transistor T7 is connected to signal LAT.

Transistor T8 connects node INV to ground. Transistor T8 is an n-type MOSFET controlled by signal CNB.

FIG. 4 is a table showing the logical values of selected nodes in the circuit diagram of FIG. 3 over the different phases of a multi-phase program operation.

The table shows the logical values of nodes SEN and INV over the following phases: phase 1, PGM (program); phase 2, PV (program verify); phase 3, data combination 2; phase 4, reset INV; phase 5, strobe; and phase 6, data invert.

The PGM rows of the table correspond to memory cells undergoing programming. Within the PGM rows, the Hvt row corresponds to a memory cell that was successfully programmed to the high threshold voltage state. Within the PGM rows, the Lvt row corresponds to a memory cell that was not successfully programmed, and stays at the low threshold voltage state.

The inhibit rows of the table correspond to program inhibited memory cells, or memory cells not undergoing programming. Within the inhibit rows, the Hvt row corresponds to a memory cell that stays at the high threshold voltage state. Within the inhibit rows, the Lvt row corresponds to a memory cell that stays at the low threshold voltage state.

Phase 1, the PGM (program) phase is discussed. For an initial programming operation, node INV of Latch1 is set to "0" if the page buffer is coupled to the bit line of a memory cell selected to undergo programming. For an initial programming operation, node INV of Latch1 is set to "1" if the page buffer is coupled to the bit line of a memory cell not selected to undergo programming. In subsequent programming operations after the initial programming operation, the value of node INV is set during phase 4, the data combination phase of the preceding programming operation.

Signals IPC and BLC go high to turn on transistors T3 and T1 respectively. The value of node INV is passed to node BL. The PGM phase is then executed, in which the memory cell accessed by the bit line coupled to the page buffer is programmed (or not, depending on the value of node INV).

Phase 2, the PV (program verify) phase is discussed. If the page buffer is coupled to the bit line of a memory cell not selected to undergo programming—i.e. for program inhibited memory cells—node SEN maintains "0" during the PV phase. If the page buffer is coupled to the bit line of a memory cell selected to undergo programming—i.e. for PGM memory cells—the value of node SEN depends on whether the memory cells was successfully programmed during the PGM phase. If the memory cell was successfully programmed from low threshold voltage LVt to high threshold voltage HVt, then node SEN is set to "1". However, if the memory cell was not successfully programmed such that it has low threshold voltage LVt, then node SEN is set to "0". In either case, node INV maintains its value from the beginning of the multi-phase operation, the PGM phase.

Signal LPC helps determine the cell threshold voltage and then set the value of node Vt.

Phase 3, the data combination phase is discussed. Signal PVB goes low, turning on transistor T6. Signal LAT from Latch1 determines whether transistor T7 is also turned on. If transistor T7 is also turned on, then transistors T6 and T7 complete an electrical connection between nodes SEN and INV. Accordingly, Latch1 data determines whether nodes SEN and INV are electrically connected. If node INV of Latch1 is "1", then node SEN is updated to "1". If node INV of Latch 1 is "0", then node SEN maintains its value.

Phase 4, the reset INV phase is discussed. Signal CNB goes high, turning on transistor T8. Node INV is electrically connected to ground. Node INV is reset to "0".

Phase 5, the strobe phase is discussed. The strobe phase sets the value of Latch1 depending on the results of PV, program verify. Signal STBN goes low, turning on transistor T4. Transistors T4 and T5 are in series and connect the supply voltage with node INV. Because the gate of transistor T5 is connected to node SEN, whether node INV is set by the supply voltage is determined by the value of node SEN. If node SEN is "1" then transistor T5 is off and node INV is not set by the supply voltage; node INV maintains its value. If node SEN is "0" then transistor T5 is on and node INV is set by the supply voltage to "1".

Phase 6, the data invert phase is discussed. Signal IPC goes high, turning on transistor T3 and passing data at node INV to node SEN. Then signal CNB goes high, turning on transistor T8. Ground is coupled to node INV, resetting node INV to "0". Then signal STBN goes low, turning on transistor T4. Because the gate of transistor T5 is connected to node SEN, whether node INV is set by the supply voltage is determined by the value of node SEN. If node SEN is "1" then transistor T5 is off and node INV is not set by the supply voltage; node INV maintains its value. If node SEN is "0" then transistor T5 is on and node INV is set by the supply voltage to "1".

After phase 6, node INV has the appropriate value for a next multi-phase operation. If node INV has "1" then the next multi-phase operation does not program the memory cell accessed by the bit line coupled to the page buffer, similar to a program inhibit memory cell. If node INV has "0" then the next multi-phase operation attempts to program the memory cell accessed by the bit line coupled to the page buffer.

Although the multi-phase program operation is discussed, the page buffer is used to perform a read operation.

Figure 5:
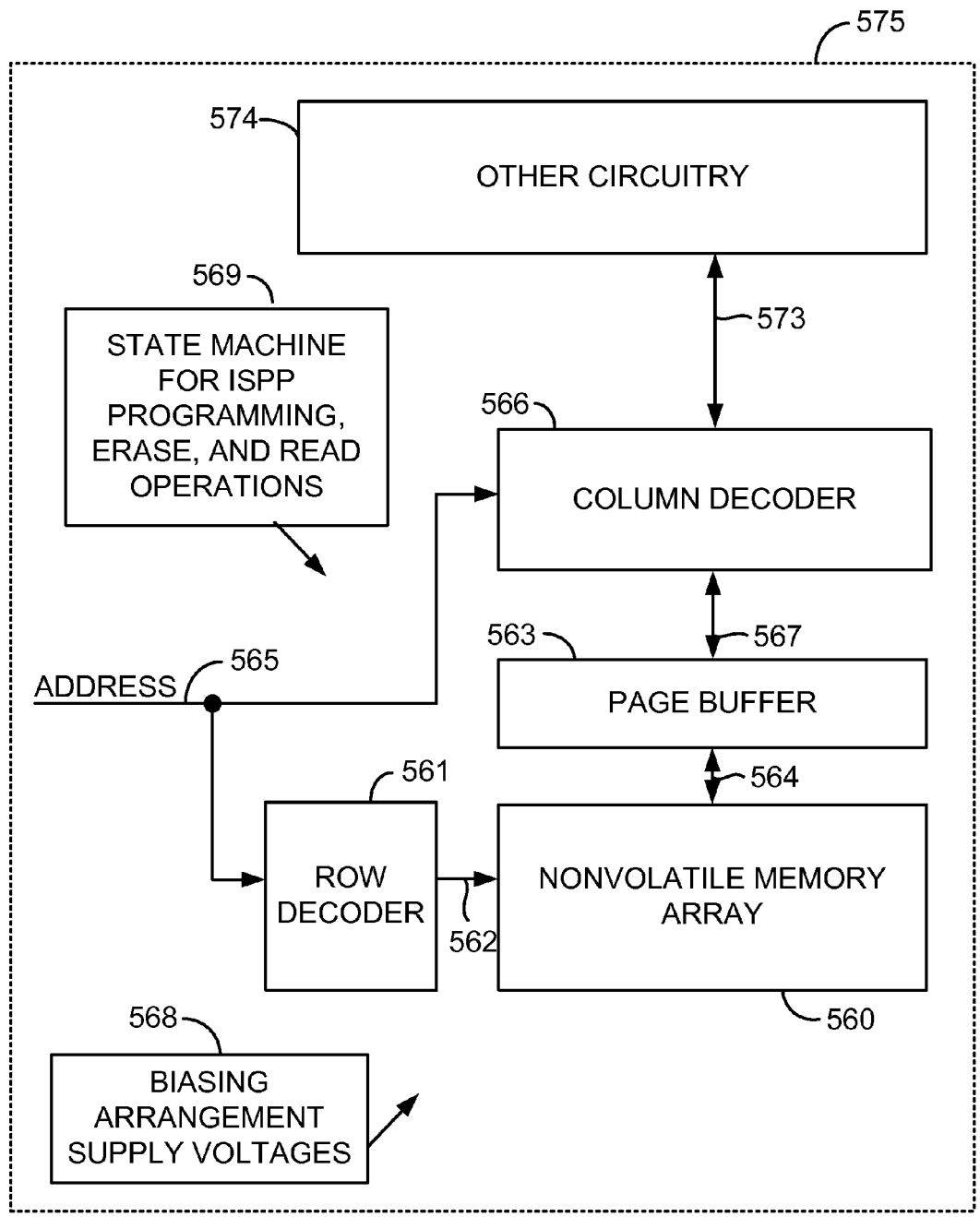
FIG. 5 is a block diagram of an integrated circuit with the disclosed charge pump system.

FIG. 5 is a block diagram of an integrated circuit with the disclosed charge pump system.

An integrated circuit 575 includes a flash memory array 560 having modified page buffer circuitry as described herein. In some embodiments, the array 560 can include multiple levels of cells. A row decoder 561 is coupled to a plurality of word lines 562 arranged along rows in the memory array 560. Column decoders in block 566 are coupled to a set of page buffers 563 in this example via data bus 567. The global bit lines 564 are coupled to local bit lines (not shown) arranged along columns in the memory array 560. Addresses are supplied on bus 565 to column decoder (block 566) and row decoder (block 561). Data is supplied via the data-in line 573 from other circuitry 574 (including for example input/output ports) on the integrated circuit, such as a general purpose processor or special purpose application circuitry, or a combination of modules providing system-on-a-chip functionality supported by the array 560. Data is supplied via the line 573 to input/output ports or to other data destinations internal or external to the integrated circuit 575.

A controller, implemented in this example as a state machine 569, provides signals to control the application of bias arrangement supply voltages generated or provided through the voltage supply or supplies in block 568 to carry out the various operations described herein. These operations include erase and read operations, and modified programming with the page buffer as described. The controller can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the controller.

The controller can include logic to implement an incremental step pulse programming (ISPP) programming sequence. This sequence follows a loop, as follows. The program bias is applied, followed by a program verify bias. Next, the logic determines whether the target cell passed the verify operation. If it did pass, then the programming operation for that target cell ends. If the cell does not pass, then the logic determines whether a retry count exceeds a retry count limit. If the retry count limit has not been exceeded, then the circuitry loops back to the program step, with an incremented retry count. If the retry count has been exceeded, then the program operation fails.

A present multi-phase program operation is going through the present programming loop, for example in an ISPP sequence. The present programming loop of the present multi-phase program operation may be the first programming attempt or a retry of a prior programming attempt.

A subsequent multi-phase program operation is the loop following the present multi-phase program operation. A preceding multi-phase program operation is the loop preceding the present multi-phase program operation.

While the current invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. An apparatus comprising:
   a page buffer circuit coupled to a bit line of a memory array, the page buffer circuit including a latch; and
   control circuitry coupled to the page buffer circuit, the control circuitry controlling a present multi-phase program operation for a memory cell accessed by the bit line coupled to the page buffer circuit, the present multi-phase program operation including:
      a program phase for which the latch stores program data;
      a program verify phase after the program phase, for which the latch stores program verify data; and
      a preparation phase after the program phase of the present multi-phase program operation and after the program verify phase of the present multi-phase program operation, for which the control circuitry causes the latch to store the preparation data indicating whether to program the memory cell in a subsequent multi-phase program operation following the present multi-phase program operation,
   wherein results of the program verify phase, and contents of the latch at a start of the present multi-phase program operation, are sufficient to determine the preparation data, and in the present multi-phase program operation, the program verify data stored in the latch for the program verify phase and the preparation data stored in the latch for the preparation phase are not required to have a same value.

2. The apparatus of claim 1, wherein in the preparation phase, the latch stores the preparation data indicating that the subsequent multi-phase program operation is to program the memory cell, responsive to the program verify phase indicating failure to program the memory cell.

3. The apparatus of claim 1, wherein in the preparation phase, the latch stores the preparation data indicating that the subsequent multi-phase program operation is not to program the memory cell, responsive to the program verify phase indicating success with programming the memory cell.

4. The apparatus of claim 1, wherein prior to the present multi-phase program operation, the latch stores one of: (i) a first value indicating that the present multi-phase program is not to program the memory cell, and (ii) a second value indicating that the present multi-phase program is to program the memory cell.

5. The apparatus of claim 1, wherein prior to the present multi-phase program operation, the latch stores a first value indicating that the present multi-phase program is not to program the memory cell, and
in the preparation phase, the latch stores the first value indicating that the subsequent multi-phase program operation is not to program the memory cell.

6. The apparatus of claim 1, wherein prior to the present multi-phase program operation, the latch stores a first value indicating that the present multi-phase program is not to program the memory cell, and
in the preparation phase, the latch stores the first value indicating that the subsequent multi-phase program operation is not to program the memory cell,
wherein the page buffer circuit includes no other latch to store the first value indicating that the subsequent multi-phase program operation is not to program the memory cell.

7. The apparatus of claim 1, wherein in the program phase, the control circuitry causes the latch to store program data indicating whether to program the memory cell accessed by the bit line coupled to the page buffer circuit.

8. The apparatus of claim 1, wherein in the program verify phase, the control circuitry causes the latch to store program verify data indicating whether the memory cell accessed by the bit line coupled to the page buffer circuit was successfully programmed.

9. The apparatus of claim 1, wherein the page buffer circuit has:
a sense node that during the program verify phase indicates whether the memory cell accessed by the bit line coupled to the page buffer circuit was successfully programmed;
a latch node that indicates whether a preceding multi-phase program operation before the present multi-phase program operation failed to program the memory cell; and
switch circuitry electrically connecting the sense node and the latch node after the program verify phase of the present multi-phase operation, responsive to the latch node indicating that the preceding multi-phase program operation failed to program the memory cell.

10. The apparatus of claim 1, wherein the page buffer circuit has:
a latch node that indicates whether a preceding multi-phase program operation before the present multi-phase program operation failed to program the memory cell, and
wherein the present multi-phase program operation includes a reset phase after the program phase of the present multi-phase program operation and after the program verify phase of the present multi-phase program operation and before the preparation phase of the present multi-phase program operation, for which the control circuitry causes the latch node to store a particular value regardless of earlier results from the present multi-phase program operation.

11. A method comprising:
during a present multi-phase program operation for a memory cell accessed by a bit line coupled to a page buffer circuit:
performing a preparation phase after a program phase of the present multi-phase program operation and after a program verify phase of the present multi-phase program operation, the preparation phase causing a latch in the page buffer circuit to store preparation data indicating whether to program the memory cell in a subsequent multi-phase program operation following the present multi-phase program operation, wherein the latch stores program data, program verify data, and the preparation data during different phases of a multi-phase program operation, wherein results of the program verify phase and contents of the latch at a start of the present multi-phase program operation are sufficient to determine the preparation data,
wherein in the present multi-phase program operation, the program verify data stored in the latch for the program verify phase and the preparation data stored in the latch for the preparation phase are not required to have a same value.

12. The method of claim 11, wherein in the preparation phase, the latch stores the preparation data indicating that the subsequent multi-phase program operation is to program the memory cell, responsive to the program verify phase indicating failure to program the memory cell.

13. The method of claim 11, wherein in the preparation phase, the latch stores the preparation data indicating that the subsequent multi-phase program operation is not to program the memory cell, responsive to the program verify phase indicating success with programming the memory cell.

14. The method of claim 11, wherein prior to the present multi-phase program operation, the latch stores (i) a first value indicating that the present multi-phase program is not to program the memory cell, and (ii) a second value indicating that the present multi-phase program is to program the memory cell.

15. The method of claim 11, wherein prior to the present multi-phase program operation, the latch stores a first value indicating that the present multi-phase program is not to program the memory cell, and
in the preparation phase, the latch stores the first value indicating that the subsequent multi-phase program operation is not to program the memory cell.

16. The method of claim 11, wherein prior to the present multi-phase program operation, the latch stores a first value indicating that the present multi-phase program is not to program the memory cell, and
in the preparation phase, the latch stores the first value indicating that the subsequent multi-phase program operation is not to program the memory cell,
wherein the page buffer circuit includes no other latch to store the first value indicating that the subsequent multi-phase program operation is not to program the memory cell.

17. The method of claim 11, wherein in the program phase, the latch stores program data indicating whether to program the memory cell accessed by the bit line coupled to the page buffer circuit.

18. The method of claim 11, wherein the page buffer circuit has:
responsive to the latch node indicating that a preceding multi-phase program operation failed to program the memory cell, electrically connecting a sense node and a latch node after the program verify phase of the present multi-phase operation, wherein the sense node, during the program verify phase, indicates whether the memory cell accessed by the bit line coupled to the page buffer circuit was successfully programmed, and wherein the latch node indicates whether a preceding multi-phase program operation before the present multi-phase program operation failed to program the memory cell.

19. The method of claim 11, wherein the page buffer circuit has:

during the present multi-phase program operation, performing a reset phase after the program phase of the present multi-phase program operation and after the program verify phase of the present multi-phase program operation and before the preparation phase of the present multi-phase program operation, for which a latch node stores a particular value regardless of earlier results from the present multi-phase program operation, wherein the latch node that indicates whether a preceding multi-phase program operation before the present multi-phase program operation failed to program the memory cell.

20. An apparatus comprising:

a page buffer circuit selectively coupled to a bit line of a memory array, including a sense node selectively coupled to the bit line of the memory array;

only one latch storing program verify data for a program verify phase and preparation data stored for a preparation phase, and the program verify data and preparation data are not required to have a same value; and a NAND string of p-type transistors electrically connecting the sense node and the only one latch.

\* \* \* \* \*